US012765198B2

(12) United States Patent
Yun et al.

(10) Patent No.: US 12,765,198 B2
(45) Date of Patent: Oct. 13, 2026

(54) LIGHT EMITTING DISPLAY DEVICE THAT EVENLY DISTRIBUTES CURRENT DENSITY AND AVOIDS CURRENT CONCENTRATION ON A SPECIFIC POINT

(71) Applicant: LG Display Co., Ltd, Seoul (KR)

(72) Inventors: JaeKyeong Yun, Gyeonggi-do (KR); Heetae Lim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 388 days.

(21) Appl. No.: 18/534,483

(22) Filed: Dec. 8, 2023

(65) Prior Publication Data

US 2024/0260361 A1 Aug. 1, 2024

(30) Foreign Application Priority Data

Jan. 30, 2023 (KR) ........................ 10-2023-0012138

(51) Int. Cl.
*H10K 59/131* (2023.01)

(52) U.S. Cl.
CPC .................................. *H10K 59/131* (2023.02)

(58) Field of Classification Search
CPC ............. H10K 59/122; H10K 59/8051; H10K 59/80521; H10K 59/80522; H10K 59/873; H10K 59/8792; H10K 59/131; H10K 59/1315; H10K 59/805; H10K 50/125; H10K 50/82; H10K 59/30; H10K 59/80524; H10K 59/82; H10K 59/88
See application file for complete search history.

(56) References Cited

U.S. PATENT DOCUMENTS

2002/0085160 A1* 7/2002 Ha ........................ G02F 1/1362 349/153
2008/0123013 A1* 5/2008 Kim .................. G02F 1/136286 349/54
2014/0176399 A1 6/2014 Lee et al.
(Continued)

FOREIGN PATENT DOCUMENTS

CN 101075584 A 11/2007
JP 2009301013 A 12/2009
(Continued)

OTHER PUBLICATIONS

English translation of KR-20140087906 (Year: 2014).*
(Continued)

*Primary Examiner* — William B Partridge
*Assistant Examiner* — David Paul Sedorook
(74) *Attorney, Agent, or Firm* — Fish & Richardson P.C.

(57) ABSTRACT

A light emitting display includes a substrate including a display area, and a non-display area surrounding the display area; a low-potential line including a first low-potential line disposed at an upper side of the substrate, and a second low-potential line disposed at a lower side of the substrate; a pad portion outside of the second low-potential line on the substrate; a first region defined at right side of the substrate, and a second region defined at left side of the substrate; a plurality of auxiliary lines connected between the first low-potential line and the second low-potential line in the second region; and a common electrode extended from the display area to be in surface contact with the low-potential line.

12 Claims, 13 Drawing Sheets

(56) References Cited

U.S. PATENT DOCUMENTS

2018/0090061 A1* 3/2018 Kim ..................... H10K 59/121
2021/0134938 A1* 5/2021 Kim ..................... H10K 59/131

FOREIGN PATENT DOCUMENTS

KR 20140087906 A * 7/2014 ........... H10K 59/131
WO 2013069233 A1 5/2013
WO 2019156024 A1 8/2019

OTHER PUBLICATIONS

Japanese Office Action dated Nov. 19, 2024 in Patent Application No. 2023-205919.
Office Action in Taiwanese Appln. No. 112147494, mailed on Jan. 8, 2025, 14 pages (with English translation).

* cited by examiner

LIGHT EMITTING DISPLAY DEVICE THAT EVENLY DISTRIBUTES CURRENT DENSITY AND AVOIDS CURRENT CONCENTRATION ON A SPECIFIC POINT

CROSS-REFERENCE TO RELATED APPLICATION

This application claims the priority of Korean Patent Application No. 10-2023-0012138 filed on Jan. 30, 2023, which is hereby incorporated by reference in its entirety.

BACKGROUND

Field of the Disclosure

The present disclosure relates to a light emitting display device having a structure that prevents damage caused by the electrical current concentration.

Description of the Background

Among display device, an electroluminescence display device, which is a self-light emitting display device, may provide excellent display quality with a high aperture ration and high luminance relative to power consumption. In particular, in the case of a top emission type display device, the common electrode is formed of a transparent conductive material. Therefore, for a large area top emission type display device, the surface resistance of the common electrode should be lowered to prevent a luminance difference from occurring over the entire display area.

To lower the resistance of the common electrode, a structure having an auxiliary line formed of a metal material having low electrical resistance is required. Further, the common electrode should be electrically connected to the auxiliary line. In this case, when a portion where current is concentrated occurs at a connection portion between the auxiliary line and the common electrode, the display device may be damaged due to overheating. Consequently, it is necessary to develop a display device having a structure that prevents the current from concentrating on a specific point under any circumstance, and evenly distributes the current density.

SUMMARY

Accordingly, the present disclosure, as for solving the problems described above, is to provide a top emission type display device or a top emission type transparent display device that realizes high density and high luminance.

The present disclosure is to provide a top emission type display having a structure in which current density is evenly distributed in several contact points where the common electrode and the low-potential line are in contact, with an auxiliary line for lowering sheet resistance of the common electrode.

The present disclosure is to provide a top emission type light emitting display device or a top emission type transparent light emitting display device having a structure capable of evenly distributing current density to contact points connecting a common voltage supply line and a common electrode.

The present disclosure is to provide a top emission type light emitting display device or a top emission type transparent light emitting display device capable of preventing power waste due to uneven current density by evenly distributing the current density of the common electrode applied over the entire area of the display panel.

In one aspect, a light emitting display comprises: a substrate including a display area, and a non-display area surrounding the display area; a low-potential line including a first low-potential line disposed at an upper side of the substrate, and a second low-potential line disposed at a lower side of the substrate; a pad portion outside of the second low-potential line on the substrate; a first region defined at right side of the substrate, and a second region defined at left side of the substrate; a plurality of auxiliary lines connected between the first low-potential line and the second low-potential line in the second region; and a common electrode extended from the display area to be in surface contact with the low-potential line.

In one aspect, the plurality of auxiliary lines is not disposed in the first region.

In one aspect, the light emitting display device further comprises: a first low-potential terminal disposed to be corresponding to the first region at the pad portion, and connected to the second low-potential line; and a second low-potential terminal and a third low-potential terminal disposed to be corresponding to the second region at the pad portion, and connected to the second low-potential line.

In one aspect, the second low-potential terminal is disposed at a first side of the second region. The third low-potential terminal is disposed at a second side of the second region opposing the first side of the second region.

In one aspect, the first low-potential terminal is disposed a first side of the first region. A gate signal terminal for supplying a gate signal is further disposed at a second side of the first region opposing the first side of the first region.

In one aspect, the light emitting display device further comprises: a plurality of dummy auxiliary lines connected to the first low-potential line except the second low-potential line in the second region.

In one aspect, the auxiliary lines and the dummy auxiliary lines are arrayed with same intervals.

In one aspect, the plurality of auxiliary lines is disposed to be in contact with the first low-potential line and the second low-potential line in the second region. An electron functional layer is disposed between the low-potential line and the cathode electrode.

In one aspect, the light emitting display device further comprises: a light emitting diode disposed in the display area. the light emitting diode includes: an anode electrode; an emission layer on the anode electrode; the electron functional layer on the emission layer; and the cathode electrode on the electron functional layer. The electron functional layer is disposed within the display area in the first region. The electron functional layer is extended from the display area to be disposed between the low-potential line and the cathode electrode in the second region.

In one aspect, the light emitting display device further comprises: a third low-potential line disposed outside of the first low-potential line on the substrate. The auxiliary line is connected to the first low-potential line in the first region. The auxiliary line is connected to the third low-potential line in the second region.

In one aspect, the light emitting display device further comprises: an insulating layer covering the first low-potential line and the third low-potential line in the non-display area. The insulating layer includes: a first contact hole disposed in the first region except the second region for exposing some of the first low-potential line; and a second contact hole disposed in the second region except the first region for exposing some of the third low-potential line.

In one aspect, the cathode electrode is connected to the first low-potential line through the first contact hole, and connected to the third low-potential line through the second contact hole.

In one aspect, the light emitting display device further comprises: a light emitting diode disposed in the display area. The light emitting diode includes: an anode electrode; an emission layer on the anode electrode; an electron functional layer on the emission layer; and the cathode electrode on the electron functional layer. the insulating layer is some extended parts of the electron functional layer from the display area to the non-display area for covering the first low-potential line and the third low-potential line.

The light emitting display according to the present disclosure may be provided with an auxiliary line for lowering the sheet electrical resistance of the common electrode constituting the light emitting diode. With the auxiliary line, the electric current density is evenly distributed across several contact points where the common electrode and the low-potential line are in contact. In addition, the light emitting display device according to the present disclosure has a structure that may evenly distribute electric current density to contact portions connecting the common voltage supply line to the common electrode. Accordingly, the electrical current density may be evenly distributed to the low-potential lines.

The light emitting display device according to the present disclosure has a structure capable of preventing power waste due to non-uniform current density by evenly dispersing the current density of the common electrode applied over the entire area of the display panel. Therefore, low-power driving is possible and power consumption may be lowered.

Further, since the current density is not concentrated in a specific region, thermal damage due to current concentration does not occur. Therefore, the life span of the product is extended, and high reliability of the product may be maintained even when continuously used for a long time.

In addition to the effects of the present disclosure mentioned above, other features and advantages of the present disclosure are described below, and from such description, it will be clearly understood by those skilled in the art to which the present disclosure belongs.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
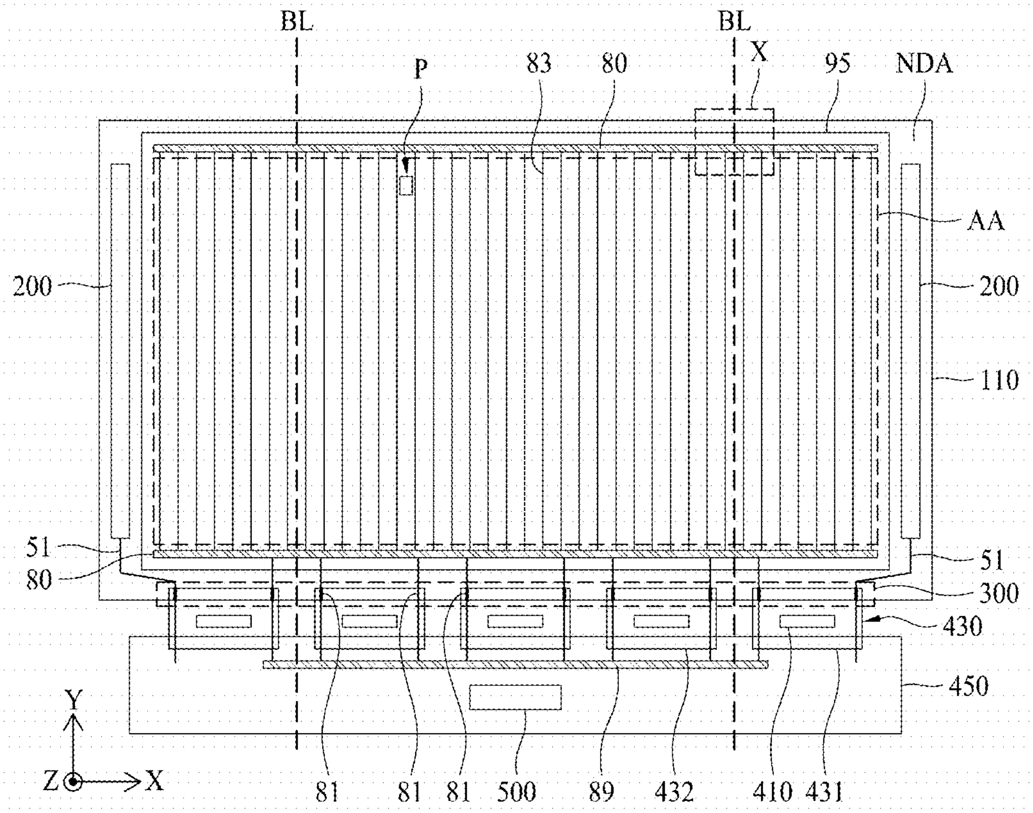
FIG. 1 is a plane view illustrating a schematic structure of a light emitting display according to a first exemplary aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these example aspects are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example aspects of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms “comprise,” “have,” “include,” and the like are used, one or more other elements may be added unless the term, such as “only,” is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various aspects of the present disclosure, where positional relationships are described, for example, where the positional relationship between two parts is described using “on,” “over,” “under,” “above,” “below,” “beside,” “next,” or the like, one or more other parts may be located between the two parts unless a more limiting term, such as “immediate(ly),” “direct(ly),” or “close(ly)” is used. For example, where an element or layer is disposed “on” another element or layer, a third layer or element may be interposed therebetween. Also, if a first element is described as positioned “on” a second element, it does not necessarily mean that the first element is positioned above the second element in the figure. The upper part and the lower part of an object concerned may be changed depending on the orientation of the object. Consequently, where a first element is described as positioned “on” a second element, the first element may be positioned “below” the second element or “above” the second element in the figure or in an actual configuration, depending on the orientation of the object.

In describing a temporal relationship, when the temporal order is described as, for example, “after,” “subsequent,” “next,” or “before,” a case which is not continuous may be included unless a more limiting term, such as “just,” “immediate(ly),” or “direct(ly),” is used.

It will be understood that, although the terms “first,” “second,” and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being “linked,” “coupled,” or “connected” to another element, that element may be directly or indirectly connected to that other element unless otherwise specified. It is to be understood that additional element or elements may be “interposed” between the two elements that are described as “linked,” “connected,” or “coupled” to each other.

It should be understood that the term “at least one” should be understood as including any and all combinations of one or more of the associated listed items. For example, the meaning of “at least one of a first element, a second element, and a third element” encompasses the combination of all three listed elements, combinations of any two of the three elements, as well as each individual element, the first element, the second element, and the third element.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, a light emitting display comprises a substrate 110, a gate (or scan) driver 200, a pad portion 300, a source driving IC (Integrated Circuit) 410, a flexible circuit film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. The display area AA includes a plurality of pixels P arrayed in a matrix manner. The display area AA further includes scan lines (or gate lines) and data lines. One pixel P is disposed at a position where the scan lines running along X-axis and the data lines running along Y-axis are crossing each other. In addition, an auxiliary line 83 running along Y-axis may be disposed at one side of some pixels P. Here, pixel P may represent one color selected from red, green and blue or red, green, blue and white. A red pixel, a green pixel and a blue pixel may be gathered together, or a red pixel, a green pixel, a blue pixel and a white pixel may be gathered together to form one unit-pixel.

The non-display area NDA, which is an area not representing the video images, may be defined at the circumference areas of the substrate 110 surrounding all or some of the display area DA. In the non-display area NDA, a low-potential line 80, the gate driver 200 and the pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (Gate driver In Panel) type. GIP type means that the gate driver 200 is directly formed on the substrate 110. For example, the gate driver 200 may include a plurality of shift registers. The GIP method refers to a structure in which the transistors included into the shift register of the gate driver 200 are formed directly on the substrate 110.

The pad portion 300 may be disposed in the non-display area NDA at one edge of the display area AA of the substrate 110. The pad portion 300 may include data pads connected to each of the data lines, driving current pads connected to the driving current lines, a high-potential pad receiving a high potential voltage, and a low-potential pad receiving a low potential voltage.

The auxiliary line 83 running along the Y-axis in the display area AA is connected to the low-potential line 80 disposed on the upper and lower sides of the display area AA in the on-emission area. For example, one end of the auxiliary line 83 is connected to the low-potential line 80 disposed in the non-display area NDA adjacent to the upper side of the display area AA, and the other end is connected to the low-potential line 80 disposed in the non-display area NDA adjacent to the lower side of the display area AA.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (Chip On Film) or COP (Chip On Plastic) type.

The flexible circuit film 430 may include a plurality of first link lines connecting the pad portion 300 to the source driving IC 410, and a plurality of second link lines connecting the pad portion 300 to the circuit board 450. The flexible circuit film 430 may be attached on the pad portion 300 using an anisotropic conducting film, so that the pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2A:
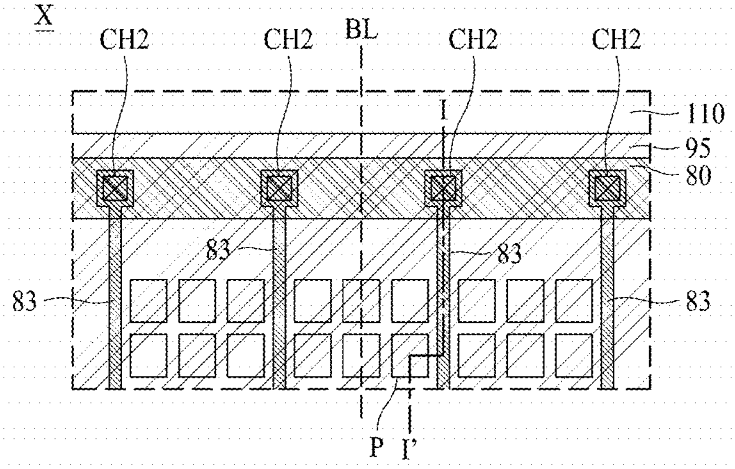
FIG. 2A is an enlarged plane view, for the portion indicated by 'X' in FIG. 1, illustrating an arrangement structure of an auxiliary line and a common electrode which are connected to the low-potential line in the outer portion of the light emitting display device according to the first exemplary aspect.
Figure 2B:
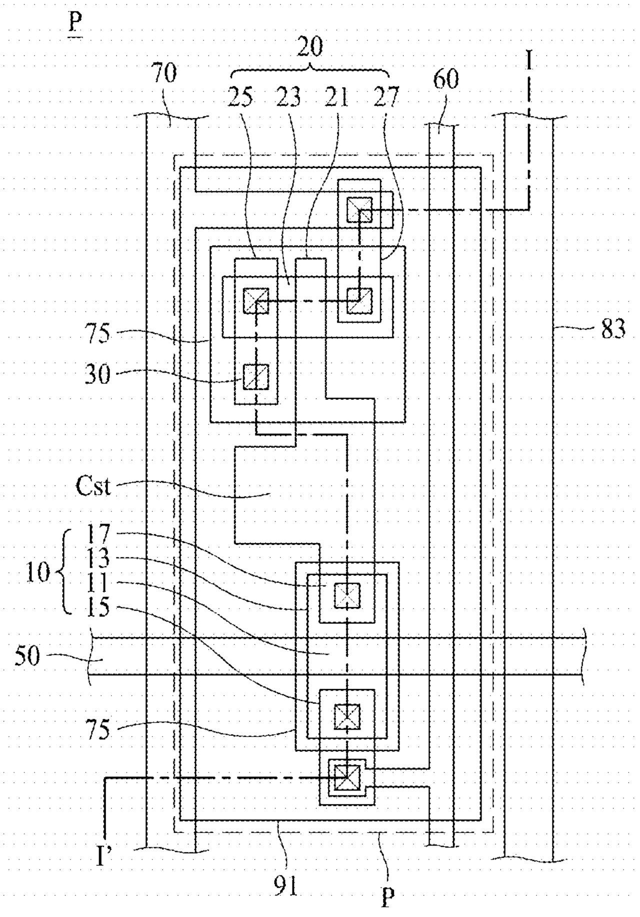
FIG. 2B is an enlarged plane view illustrating the structure of one pixel of FIGS. 1 and 2A.
Figure 3:
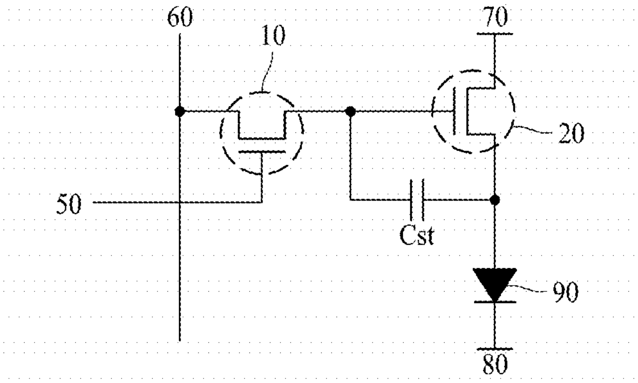
FIG. 3 is a circuit diagram illustrating a structure of one pixel included in the light emitting display according to the first exemplary aspect of the present disclosure.

FIG. 2A is an enlarged plane view, for the portion indicated by 'X' in FIG. 1, illustrating an arrangement structure of an auxiliary line and a common electrode which are connected to the low-potential line in the outer portion of the light emitting display device according to the first aspect. FIG. 2B is an enlarged plane view illustrating the structure of one pixel of FIGS. 1 and 2A. FIG. 3 is a circuit diagram illustrating a structure of one pixel included in the light emitting display according to the first aspect of the present disclosure.

Referring to FIGS. 2A and 2B, the arrangement structure of the auxiliary line and the common electrode connected to the low-potential line at the outer portion of the light emitting display device according to the first aspect of the present disclosure.

A plurality of pixels P are disposed on the substrate 110. For example, a red pixel, a green pixel and a blue pixel may be arranged sequentially in the horizontal direction in a plan view. The red pixel, the green pixel and the blue pixel may form one unit-pixel. In some cases, each of these red, green and blue pixels may be referred to as a sub-pixel, and the unit pixel that groups them may be referred to as a pixel. As another example, a red pixel, a green pixel, a white pixel and a blue pixel may be arranged consecutively in the horizontal direction. The red pixel, the green pixel, the white pixel and the blue pixel may form one unit-pixel.

One auxiliary line 83 may be disposed in each of the plurality columns of pixels P. For example, an auxiliary line 83 extending along the Y-axis direction may be disposed on one side of the three pixels P which are arrayed along the Y-axis.

One end of the auxiliary line 83 overlaps the low potential line 80 disposed on the upper side of the substrate 110. For example, the auxiliary line 83 may be connected to the low-potential line 80 through a contact hole formed in the insulating layer covering the end portion of the auxiliary line 83.

Further, referring to FIGS. 2B and 3, a structure of each pixel P of the light emitting display device according to the first aspect of the present disclosure. Each pixel P of the light emitting display device according to the first aspect may be defined by a scan line 50, a data line 60 and a driving current line 70. Within each pixel P, a switching thin film transistor 10, a driving thin film transistor 20 and a light emitting diode 90 and a storage capacitor Cst (or capacitance) may be disposed. The driving current line 70 is supplied with a high-potential voltage for driving the light emitting diode 90.

The switching thin film transistor 10 may be configured to connected to the scan line 50 and the data line 60. The switching thin film transistor 10 may include a gate electrode 11, a semiconductor layer 13, a source electrode 15 and a drain electrode 17. The gate electrode 11 may be a portion of the scan line 50. The semiconductor layer 13 may overlap with the gate electrode 11. For example, the semiconductor layer 13 may be disposed as crossing the scan line 50. The overlapped portion of the semiconductor layer 13 with the gate electrode 11 may be defined as a channel region. The source electrode 15 is branched from or connected to the data line 60, and the drain electrode 17 is connected to the driving thin film transistor 20. By supplying the data signal to the driving thin film transistor 20, the switching thin film transistor 10 may play role of selecting a pixel to operate.

The driving thin film transistor 20 may play role of driving the light emitting diode 90 included into a pixel P selected by the switching thin film transistor 10. The driving thin film transistor 20 includes a gate electrode 21, a semiconductor layer 23, a source electrode 25 and a drain electrode 27. The gate electrode 21 of the driving thin film transistor 20 is connected to the drain electrode 17 of the switching thin film transistor 10. The semiconductor layer 23 may be disposed as crossing the gate electrode 21. The overlapped portion of the semiconductor layer 23 with the gate electrode 21 may be defined as a channel region. The drain electrode 27 of the driving thin film transistor 20 is branched from or connected to the driving current line 70, and the source electrode 25 is connected to an anode electrode 91 of the light emitting diode 90 (or light emitting element). The storage capacitor may be disposed between the gate electrode 21 of the driving thin film transistor 20 and the anode electrode 91 of the light emitting diode 90.

The driving thin film transistor 20 is disposed between the driving current line 70 and the light emitting diode 90. The driving thin film transistor 20 controls the amount of the electric current flowing from the driving current line 70 to the light emitting diode 90 according to the voltage difference between the gate electrode 21 and the source electrode 25.

Further referring to FIG. 4, a cross-sectional structure of the light emitting display device according to the present disclosure will be described. The display device according to the present disclosure includes a substrate 110, a driving element layer 220 and a light emitting element layer 330. The driving element layer 220 includes a plurality of thin layers formed on the substrate 110. The driving element layer 220 may include a switching thin film transistor 10 and a driving thin film transistor 20.

In detail, a data line 60, a driving current line 70, an auxiliary line 83 and a light shielding layer 75 are formed on the substrate 110. The light shielding layer 75 may have an island shape which is separated from the data line 60 and the driving current line 70 and the light shielding layer 75, and overlapped with the semiconductor layers 13 and 23.

A buffer layer 31 is deposited on the substrate 110 as covering the driving current line 70, the auxiliary line 83, the data line 60 and the light shielding layer 75. The semiconductor layer 13 of the switching thin film transistor 10 and the semiconductor layer 23 of the driving thin film transistor 20 are formed on the buffer layer 31. At least the channel regions of the semiconductor layers 13 and 23 may be disposed to overlap the light shielding layer 75.

A gate insulating layer 33 is deposited on the substrate 110 having the semiconductor layers 13 and 23. A gate electrode 11 overlapping the semiconductor layer 13 of the switching thin film transistor 10, and a gate electrode 21 overlapping the semiconductor layer 23 of the driving thin film transistor 20 are formed on the gate insulating layer 33. In addition, at both sides of the gate electrode 11 of the switching thin film transistor 10, a source electrode 15 contacting to one side of the semiconductor layer 13 and being apart from the gate electrode 11, and a drain electrode 17 contacting to the other side of the semiconductor layer 13 and being apart from the gate electrode 11 are formed. Likewise, at both sides of the gate electrode 21 of the driving thin film transistor 20, a source electrode 25 contacting to one side of the semiconductor layer 23 and being apart from the gate electrode 21, and a drain electrode 27 contacting to the other side of the semiconductor layer 23 and being apart from the gate electrode 21 are formed.

Even though the gate electrodes 11 and 21, the source electrode 15 and 25 and drain electrodes 17 and 27 are formed on the same layer, they are separated from each other spatially and electrically. In addition, the source electrode 15 of the switching thin film transistor 10 is connected to the data line 60 via a contact hole penetrating the gate insulating layer 33 and the buffer layer 31. Even though it is not shown in figures, the drain electrode 27 of the driving thin film transistor 20 is connected to the driving current line 70 via a contact hole penetrating the gate insulating layer 33.

A passivation layer 35 is deposited on the substrate 110 having the thin film transistors 10 and 20. The passivation layer 35 may be made of an inorganic material such as silicon oxide (SiOx) and silicon nitride (SiNx).

The light emitting element layer 330 is formed on the driving element layer 220. The light emitting element layer 330 is includes a light emitting diode 90. Before forming the light emitting diode 90, a planarization layer 37 is deposited on the passivation layer 35. The surface of the substrate 110 on which the thin film transistors 10 and 20 are formed is not uniform or even, so the planarization layer 37 is a thin film layer for flattening the uneven surface condition. To make the height difference being even, the planarization layer 37 may be formed of an organic material. A pixel contact hole 30 exposing a part of the source electrode 25 of the driving thin film transistor 20 is formed in the passivation layer 35 and the planarization layer 37.

The light emitting diode 90 includes an anode electrode 91, an emission layer 93 and a cathode electrode 95. The light emitting diode 90 generates light according to the current controlled by the driving thin film transistor 20. In other words, the light emitting diode 90 displays an image by emitting light according to an electric current controlled by the driving thin film transistor 20. The anode electrode 91 of the light emitting diode 90 is connected to the source electrode 25 of the driving thin film transistor 20, and the cathode electrode 95 is connected to the low-potential line 80 to which a low-potential voltage is supplied. The light emitting diode 90 is driven by the electrical current flowing from the driving current line 70 to the low-potential line 80 by the driving thin film transistor 20.

The anode electrode 91 is formed on the upper surface of the planarization layer 37. The anode electrode 91 is connected to the source electrode 25 of the driving thin film transistor 20 via the pixel contact hole 30. The anode electrode 91 has different structure depending on the emission type of the light emitting diode 90. For example, in the case of the bottom emission type that provides light in the direction in which the substrate 110 is placed, the anode electrode 91 may be formed of a transparent conductive material. For another example, in the case of the top emission type that provide light in the upper direction opposite to the substrate 110, the anode electrode 91 may be made of a metal material with excellent light reflectance. Since the present disclosure relates to a top emission type display device, the anode electrode 91 may include a metal material.

A bank 97 is formed on the substrate 110 having the anode electrode 91. The bank 97 may be made of an insulating material such as inorganic insulating material or organic insulating material. Here, the bank 97 is made of an organic insulating material. The bank 97 covers circumferential areas of the anode electrode 91, and exposes middle portions of the anode electrode 91. The exposed portions of the anode electrode 91 is defined as an emission area EA, and the covered portions of the anode electrode 91 by the bank 97 is defined as a non-emission area EA.

The emission layer 93 is deposited on the anode electrode 91 and the bank 97. The emission layer 93 may be stacked on the entire display area AA of the substrate 110 to cover the anode electrode 91 and the bank 97. For an example, the emission layer 93 may include at least two emission parts for generating white light. In detail, the emission layer 93 may include a first emission part and a second emission part vertically stacked for generating white light by mixing the first light from the first emission part and the second light from the second emission part.

For another example, the emission layer 93 may include any one of a blue emission part, a green emission part, and a red emission part for generating light corresponding to a color set in each pixel. Further, the light emitting diode 90 may include a functional layer for improving light emitting efficiency and/or lifetime of the emission layer 93.

A cathode electrode 95 is deposited on the entire surface of the substrate 110 on which the emission layer 93 is formed. The cathode electrode 95 is deposited to make surface contact with the emission layer 93. The cathode electrode 95 is formed over the entire substrate 110 to be commonly connected to the emission layer 93 deposited in all pixels. In the case of the top emission type, the cathode electrode 95 may include a transparent conductive material. For example, the cathode electrode 95 may be made of a transparent conductive material such as indium-tin-oxide (ITO) and indium-zinc-oxide (IZO).

In the top emission type, the metal oxide, which is a transparent conductive material used for the cathode electrode 95, may have a sheet electric resistance very higher than that of the metal material. Therefore, when the area of the cathode electrode 95 is large such a large-area TV monitor, there are portions where the sheet resistance increases, and then the level of low voltage may not be secured uniformly over the entire area of the cathode electrode 95.

To solve the problems, a structure that lowers the sheet resistance of the cathode electrode 95 is required. The auxiliary line 83 is the element for lowering the sheet resistance of the cathode electrode 95. Hereinafter, referring to FIGS. 2A, 2B and 4, a structure of upper side of the substrate 110, where the cathode electrode 95 is connected to the low-potential line 80 and the auxiliary line 83, will be described.

The auxiliary line 83 may be formed on the substrate 110 at first. Otherwise, the auxiliary line 83 may be formed at the same layer and of the same material with the source electrodes 15 and 25 and the drain electrodes 17 and 27 of the thin film transistors 10 and 20. Here, the auxiliary line 83 is formed at the same layer with the data line 60 and the driving current line 70.

The auxiliary line 83 may be disposed at one side of the pixel P as being parallel with the data line 60 and the driving current line 70. There is no need for the auxiliary line 83 to be disposed for each pixel P. For example, one auxiliary line 83 may be disposed for every 3 pixels, 6 pixels or 12 pixels along the horizontal direction. As shown in FIGS. 2A and 2B, the auxiliary line 83 may be disposed slightly away from one side of the pixel P. For another example, the auxiliary line 83 may be placed overlapping with the pixel P, and may be disposed between the data line 60 and the driving current line 70.

The buffer layer 31 and the gate insulating layer 33 are sequentially stacked on the auxiliary line 83. A first contact hole CH1 is formed at the gate insulating layer 33 and the buffer layer 31 for exposing some portions of the auxiliary line 83. An auxiliary electrode 85 may be formed on the gate insulating layer 33. The auxiliary electrode 85 is connected to the auxiliary line 83 via the first contact hole CH1. For another example, the auxiliary electrode 85 may be omitted.

The passivation layer 35 is stacked on the auxiliary electrode 85. The planarization layer 37 is stacked on the passivation layer 35. A second contact hole CH2 is formed at the planarization layer 37 and the passivation layer 35 for exposing some portions of the auxiliary electrode 85. For another example, some portions of the planarization layer 37 and the passivation layer 35 are removed for exposing all of the auxiliary electrode 85.

The low-potential line 80 is formed on the planarization layer 37. The low-potential line 80 may be made of the same material with the anode electrode 91.

The bank 97 is formed on the anode electrode 91. The bank 97 may be patterned to expose all the low-potential line 80 made of the same material and at the same layer with the anode electrode 91. As the result, all of the low-potential line 80 may be exposed on the planarization layer 37. The low-potential line 80 is contacted to the auxiliary electrode 85 via the second contact hole CH2 formed at the planarization layer 37 and the passivation layer 35. Accordingly, the low-potential line 80 is electrically connected to the auxiliary line 83 through the auxiliary electrode 85.

The emission layer 93 is deposited on the anode electrode 91 and the bank 97. The emission layer 93 is commonly stacked as covering all of the pixels P disposed on the substrate 110. However, the emission layer 93 may be extended to the upper surface of the bank 97 in the non-display area NDA. Therefore, the low-potential line 80 is not contacted to the emission layer 93.

The cathode electrode 95 is deposited on the emission layer 93. The cathode electrode 95 is commonly stacked as covering all pixels P disposed on the substrate 110. In particular, the cathode electrode 95 may be extended to the outer most portion of the non-display area NDA, so the cathode electrode 95 may be disposed to be in direct surface contact with the low-potential line 80.

Figure 4:
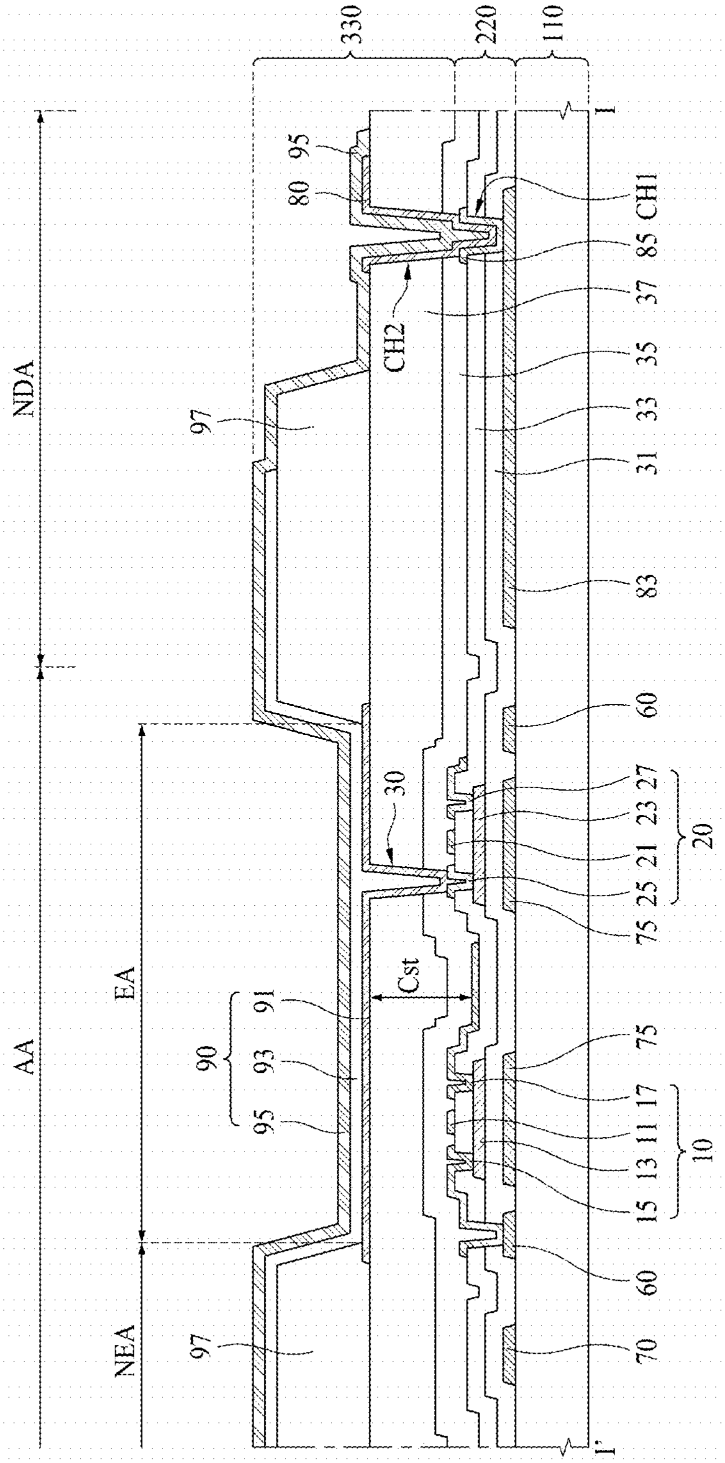
FIG. 4 is a cross-sectional view along cutting line I-I' in FIG. 2B, for illustrating a structure of the light emitting display according to the first exemplary aspect of the present disclosure.

In FIGS. 2A, 2B and 4, at the upper side of the substrate 110, the cathode electrode 95 is connected to the low-potential line 80. Likewise, the cathode electrode 95 may be connected to the low-potential line 80 at the lower side of the substrate 110.

The light emitting display device according to the first aspect of the present disclosure has a structure in which the cathode electrode 95 made of a transparent conductive material is connected to the low-potential lines 80 which are disposed at the upper side and lower side of the substrate 110, respectively. Further, the low-potential line 80 disposed at the upper side and the low-potential line 80 disposed at the lower side are connected each other through the auxiliary line 83 there-between.

In addition, as shown in FIG. 1, the low-potential line 80 may be supplied with the low-potential electric voltage through the low-power supplying line 89 disposed on the circuit board 450. In this case, the low-power supplying line 89 provided on the circuit board 450 may be connected to the low-potential line 80 provided on the substrate 110 through the connection lines provided on the flexible circuit film 430.

For example, a plurality of the flexible circuit films 430 is provided for connecting the circuit board 450 to the substrate 110. As shown in FIG. 1, five flexible circuit films 430 may be provided. The flexible circuit film 430 is an element for connecting the signal lines of the substrate 110 to the signal lines of the circuit board 450, respectively. As the number of the signal lines increases, the number of the flexible circuit films 430 is required.

As the number of flexible circuit films 430 increases, the number of source driving integrated circuits 410 also increases. Accordingly, in a high-resolution display device, the number of source driving integrated circuits 410 and the flexible circuit film 430 increases. Therefore, the cost gradually increases, and the structure also becomes increasingly complex.

To save the cost and simplify the structure, it is required to reduce the number of the source driving integrated circuits 410 and the flexible circuit films 430 as much as possible. In addition, the flexible circuit film 430 also needs to be provided with a signal line connected to the gate supply line 51 that provides the gate signal to the gate driver 200.

To do so, as shown in FIG. 1, the source driving integrated circuit 410 and the flexible circuit film 430 disposed on the outermost sides of the left and right sides of the substrate 110 may be provided with a connection structure for supplying a gate signal to the gate supply line 51. As a result, a non-symmetrical structure may be provided in which a signal line connected to the gate supply line 51 is disposed on one side of the outermost source driving integrated circuit 410 and the flexible circuit film 430, but a signal line connected to the low-potential terminal 81 is disposed on the other side of the outermost source driving integrated circuit 410 and the flexible circuit film 430.

Here, as shown in FIG. 1, the source driving integrated circuit 410 and the flexible circuit film 430 disposed at middle portions of the substrate 110 may have two low-potential terminals 81 for connecting to the low-potential line 80 which are disposed at both sides. However, the source driving integrated circuit 410 and the flexible circuit film 430 disposed at outermost side of the substrate 110 may have only one low-potential terminal 81 for connecting to the low-potential line 80.

In the structure shown in FIG. 1, when supplying a higher electric current to increase the brightness (or luminance) of the display device, a problem of increased electric current density may occur at the one low-potential terminal 81 provided on the outermost flexible circuit film 430. For the flexible circuit film 430 disposed at the middle portions of the substrate 110 in which two low-potential terminal 81 are disposed at both sides, respectively, the current density may be divided into two low-potential terminal 81, so that the electric current density may be distributed evenly when a high current is supplied. However, electric current density may be concentrated on one low-potential terminal 81, in the flexible circuit film 430 disposed on the outermost side.

Hereinafter, the problems for the concentration of the electric current density will be explained with the case that a first flexible circuit film 431 is disposed on the rightmost side of the substrate 110 and a second flexible circuit film 432 is disposed on a central portion of the substrate 110. The first flexible circuit film 43 and the second flexible circuit film 432 have the same size, and are arranged to equally distribute the signal lines of the substrate 110. In the display area AA, the area corresponding to the first flexible circuit film 431 and the area corresponding to the second flexible circuit film 432 may be distinguished by the border line BL. Each of the first flexible circuit film 431 and the second flexible circuit film 432 is supplied with the same electric current of 'i'.

The border line BL illustrated in FIGS. 1, 5, 6, 7, 10 and 13 showing overall plan structures of the display device according to various aspects of the present disclosure and FIGS. 2A, 8, 11 and 14 showing enlarged plan structures of the present disclosure is for distinguishing the area corresponding to the flexible circuit film disposed at the rightmost side from the area corresponding to the flexible circuit film disposed at the middle portion, or for distinguishing the area corresponding to the flexible circuit film disposed at the leftmost side from the area corresponding to the flexible circuit film disposed at the middle portion.

As shown in FIG. 1, since the second flexible circuit film 432 has two low-potential terminals 81, each of the low-potential terminal 81 may be supplied with the electric current of 'i/2'. On the other hand, since the first flexible circuit film 431 has only one low-potential terminals 81, the low-potential terminal 81 may be supplied with the electric current of 'i'. therefore, the low-potential terminal 81 of the first flexible circuit film 431 has the doubled current density.

As the result, excessive heat may be occurred at the connecting part of the low-potential terminal 81 of the first flexible circuit film 431 disposed at the outermost side. When this heat is concentrated for a long period of time, it may cause severe damage to the display device.

In the following aspects, various structures for preventing concentration of the electric current density and dispersing the electric current density that may occur due to the provision of the first flexible circuit film 431 having a non-symmetrical structure will be described.

Figure 5:
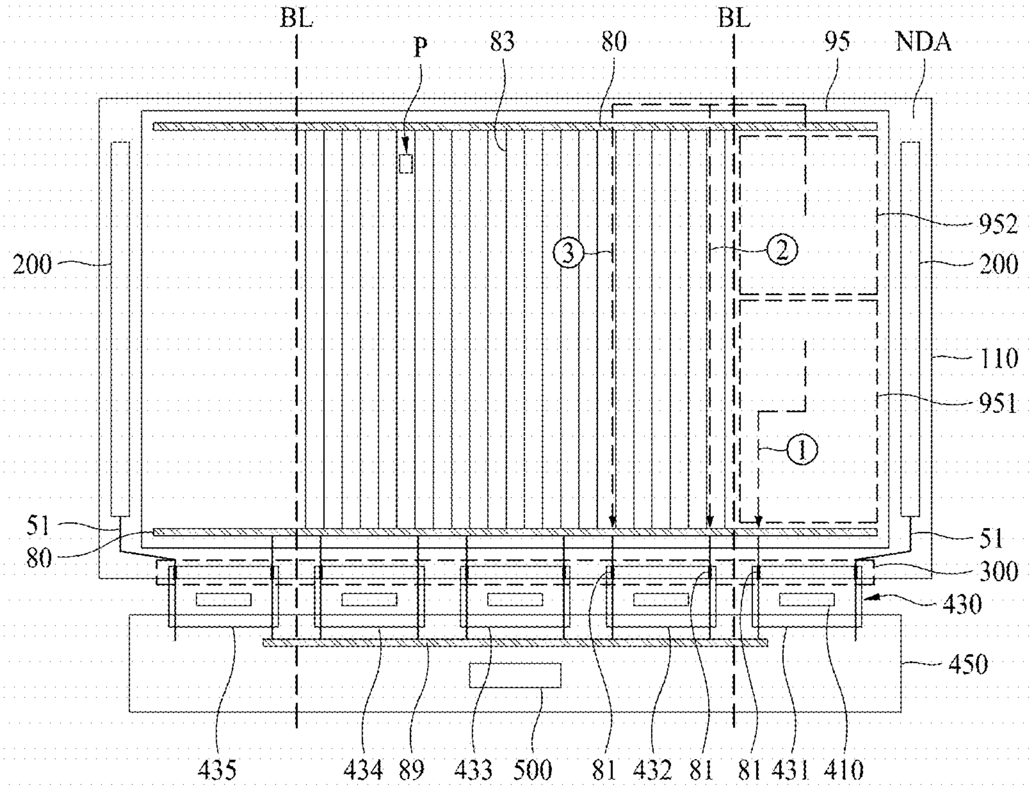
FIG. 5 is a plane view illustrating a structure of a light emitting display device according to a second exemplary aspect of the present disclosure.

Hereinafter, referring to FIG. 5, a structure of the light emitting display device according to a second aspect of the present disclosure will be described. FIG. 5 is a plane view illustrating a structure of a light emitting display device according to a second aspect of the present disclosure. The light emitting display device according to the second aspect show in FIG. 5 has very similar structure with that of the first aspect. According to the second aspect, in the display area AA, the auxiliary line is not disposed at the portion corresponding to the outermost flexible circuit films 431 and 435, but disposed at the portion corresponding to the middle flexible circuit films 432, 433 and 434.

The following description will focus on parts that are mainly different from the first aspect. In the display area AA, the auxiliary line 83 is not disposed at the area (or portion) corresponding to the first flexible circuit film 431 disposed at the rightmost side. However, in this area, the cathode electrode 95 is connected to the low-potential lines 80 disposed at the upper side and the lower side of the substrate 110.

For example, the cathode electrode 95 may be divided into lower area 951 and upper area 952 based on the border line BL, at the area (or portion) corresponding to the first flexible circuit film 431 disposed. For an example, the area ratio of the lower area 951 and the upper area 952 may be divided into 3:2.

The low-potential voltage may be supplied to the cathode electrode 95 through low-potential line 80 which is located nearby. Therefore, the lower area 951 of the cathode electrode 95 may be supplied with the low-potential voltage through the low-potential line 80 disposed at the lower side of the substrate 110. The upper area 952 of the cathode electrode 95 may be supplied with the low-potential voltage through the low-potential line 80 disposed at the upper side of the substrate 110.

Accordingly, the electric current supplied to the lower area 951 may be '3i/5' through the low-potential terminal 81 connected to the low-potential line 80 disposed at the lower side. Further, the electric current supplied to the upper area 952 may be '2i/5' through the low-potential line 80 disposed at the upper side. The electric current flowing through the low-potential line 80 disposed at the upper side may flow to the low-potential line 80 disposed at the lower side through the auxiliary line 83 disposed at the area corresponding to the second flexible circuit film 432. That is, in FIG. 5, the electric current flown flowing the path ① may be '3i/5=6i/10'.

Since the low-potential line 80 disposed at the area corresponding to the second flexible circuit film 432 has two low-potential terminals 81, an electric current of 'i/2' flows through each low-potential terminal 81. Here, the electric current of '2i/5' received from the upper area 952 corresponding to the first flexible circuit film 431 may also flow by dividing into two areas.

The electric current of 'i/2+i/5=7i/10' may flow at each of two low-potential terminals 81 disposed at the second flexible circuit film 432. Accordingly, in FIG. 5, the electric current flowing to path ② is '7i/10', and the electric current flowing to path ③ is also '7i/10'.

Consequently, the electric current flowing through each of the paths ①, ②, and ③ is maintained in an almost identical condition. The electric current density is not concentrated on the low-potential terminal 81 of the first flexible circuit film 431 disposed on the outermost side, and excessive heat is not generated.

Figure 6:
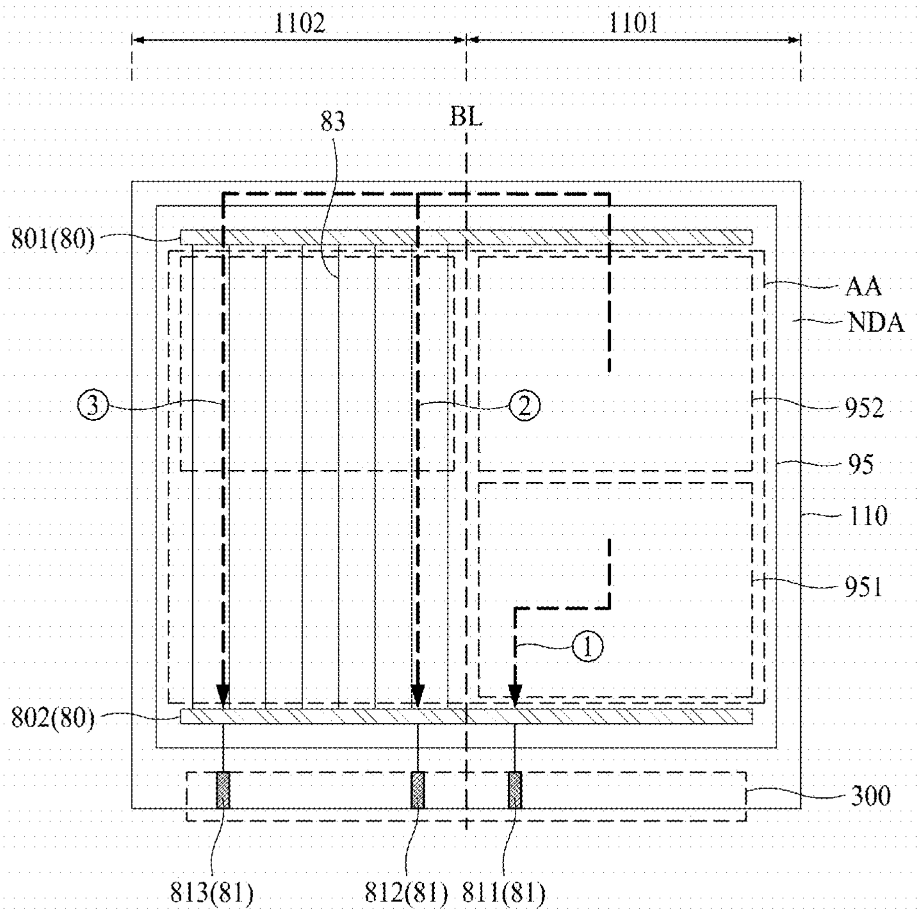
FIG. 6 is a plane view illustrating a characteristic structure of a light emitting display device according to an exemplary aspect of the present disclosure.

Hereinafter, referring to FIG. 6 a structural feature of the light emitting display device according to an example of the present disclosure. FIG. 6 is a plane view illustrating a characteristic structure of a light emitting display device according to an aspect of the present disclosure.

The light emitting display device according to an aspect of the present disclosure includes a substrate 110, a pad portion 300, a low-potential line 80, a low-potential terminal 81, an auxiliary line 83 and a common electrode 95 (or, cathode electrode). The substrate 110 includes a display area AA and a non-display area NDA. The display area AA is defined at a middle portion of the substrate 110. The non-display area NDA is defined as surrounded the display area AA. The substrate 110 is divided into a first region 1101 and a second region 1102 by a border lien BL disposed on the substrate 110. The first region 1101 is allocated at the right side of the border line BL dispose on the substrate 110, and the second region 1102 is allocated at the left side of the border line BL.

The low-potential line 80 has a first low-potential line 801 and a second low-potential line 802 parallelly facing each other. The first low-potential line 801 may be disposed at the upper side of the substrate 110 along the horizontal direction as crossing over the first region 1101 and the second region 1102. Further, the second low-potential line 802 may be disposed at the lower side of the substrate 110 along the horizontal direction as crossing over the first region 1101 and the second region 1102.

The pad portion 300 may be disposed at the lower side of the substrate 110. For example, the pad portion 300 may be disposed at outside of the second low-potential line 802 disposed at the lower side of the substrate 110. The low-potential terminal 81 may be disposed at the pad portion 300.

The low-potential terminal 81 disposed at the pad portion 300 is connected to the second low-potential line 802. One low-potential terminal 81 may be disposed at the first region 1101. In addition, two low-potential terminals 81 may be disposed at the second region 1102. For example, the first region 1101 includes a first low-potential terminal 811, and the second region 1102 includes a second low-potential terminal 812 and a third low-potential terminal 813.

The auxiliary line 83 may include a plurality of segment lines connecting the first low-potential line 801 and the second low-potential line 802. In particular, the auxiliary line 83 is not disposed at the first region 1101, but is disposed at the second region 1102.

The common electrode 95 is deposited as one sheet layer covering entire area of the substrate 110. The common electrode 95 covers the first region 1101 and the second region 1102. The common electrode 95 overlaps the first low-potential line 801 and the second low-potential line 802 and contacts in surface with them.

With this structure, at the first region 1101, a lower portion 951 of the common electrode 95 is supplied with the low-potential voltage from the first low-potential terminal 811 connected to the second low-potential line 802. However, at the first region 1101, an upper portion 952 of the common electrode 95 is supplied with the low-potential voltage from the first low-potential line 801. In particular, the upper potion 952 is connected to the first low-potential line 801, to the second low-potential line 802 disposed at the second region 1102 through the auxiliary line 83 and then to the second low-potential terminal 812 and the third low-potential terminal 813 disposed at the second region 1102.

Therefore, at the first region 1101 including only one first low-potential terminal 811, the electric current for the lower portion 951 is supplied from the first low-potential terminal 811. At the same time, the electric current for the upper potion 952 is supplied from the second region 1102 by dividing into the second low-potential terminal 812 and the third low-potential terminal 813. Accordingly, an excessively high electric current density is not concentrated on the first low-potential terminal 811, but is distributed to the neighboring second low-potential terminal 812 and the third low-potential terminal 813.

In the following aspects, the basic structure and current distribution mechanisms are similar to those of the second aspect, but cased in which the shape of specific elements or connection structures may be implemented in various ways will be described.

Figure 7:
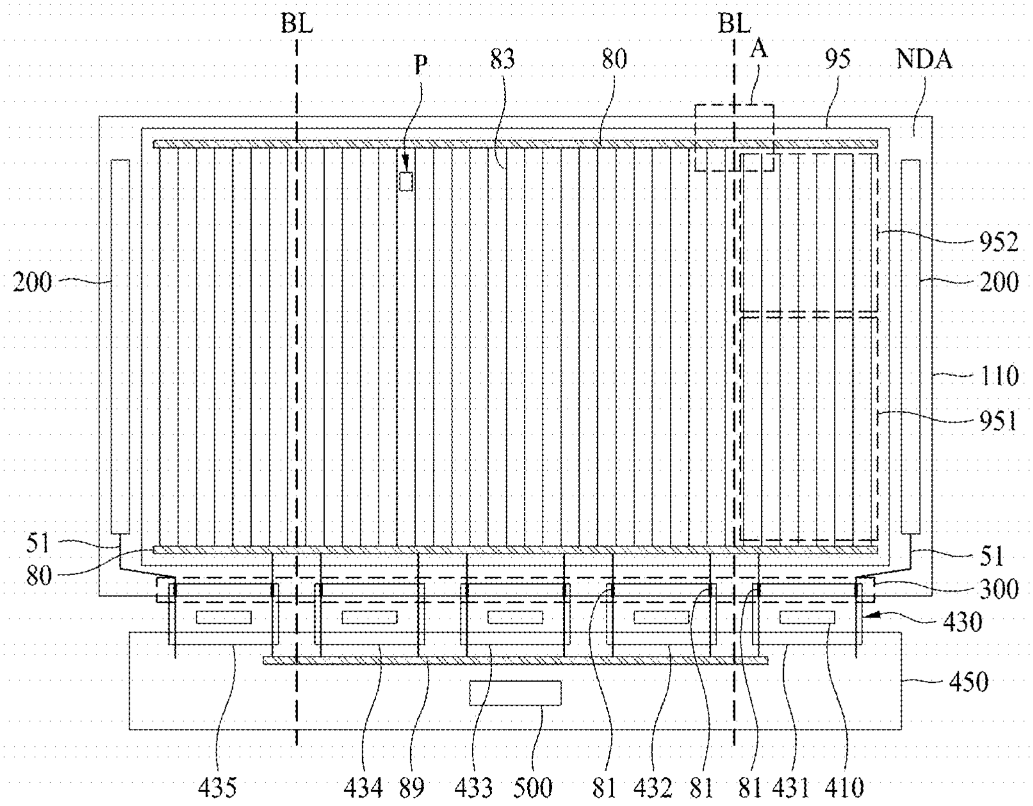
FIG. 7 is a plane view illustrating a structure of a light emitting display device according to a third exemplary aspect of the present disclosure.
Figure 8:
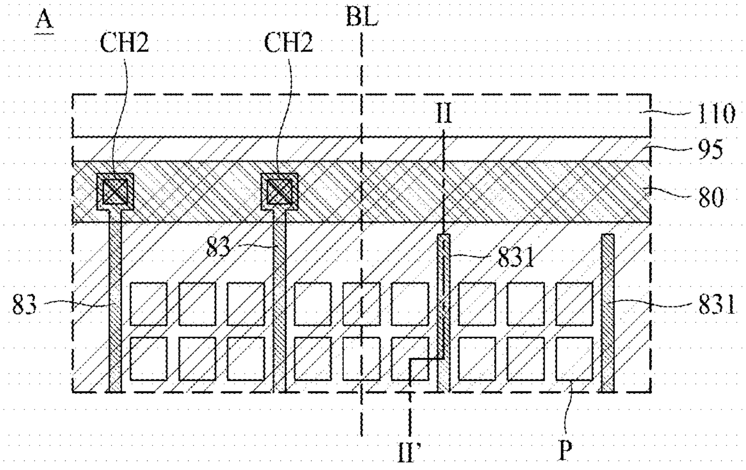
FIG. 8 is an enlarged plane view, for the portion indicated by 'A' in FIG. 7, illustrating an arrangement structure of an auxiliary line and a common electrode which are connected to the low-potential line in the outer portion of the light emitting display device according to the third exemplary aspect.

Hereinafter, referring to FIGS. 7 to 9, a third aspect of the present disclosure will be described. FIG. 7 is a plane view illustrating a structure of a light emitting display device according to a third aspect of the present disclosure. FIG. 8 is an enlarged plane view, for the portion indicated by 'A' in FIG. 7, illustrating an arrangement structure of an auxiliary line and a common electrode which are connected to the low-potential line in the outer portion of the light emitting display device according to the third aspect.

Referring to FIGS. 7 and 8, a light emitting display device according to the third aspect may have very similar structure with that of the second aspect. The difference is on that, in the third aspect, a dummy auxiliary line 831 is further included at the portion corresponding to the outermost flexible circuit films 431 and 435.

A light emitting display device according to the third aspect includes an auxiliary line 83 at a middle portion of the display area AA corresponding to the middle flexible circuit films 432, 433 and 434. In addition, a dummy auxiliary line 831 is disposed at the side portion of the display area AA corresponding to the outermost flexible circuit films 431 and 435.

The dummy auxiliary line 831 is connected to the low-potential line 80 disposed at the lower side of the substrate 110. However, the dummy auxiliary line 831 is not electrically nor physically connected to the low-potential line 80 disposed at the upper side of the substrate 110.

Figure 9:
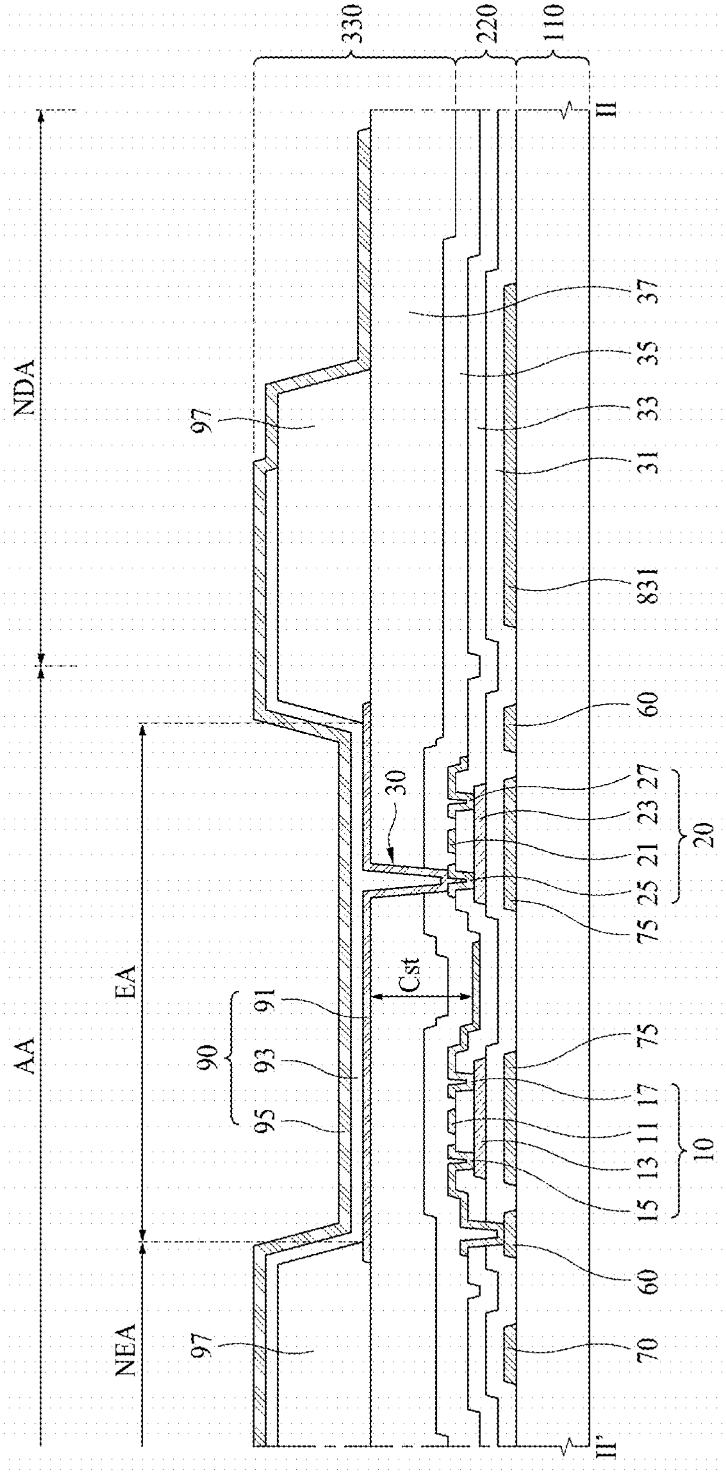
FIG. 9 is a cross-sectional view along cutting line II-II' in FIG. 8, for illustrating a structure of the light emitting display according to the third exemplary aspect of the present disclosure.

FIG. 9 is a cross-sectional view along cutting line II-II' in FIG. 8, for illustrating a structure of the light emitting display according to the third aspect of the present disclosure. For example, referring to FIG. 9, the dummy auxiliary line 831 may be disposed to be spaced apart from the low-potential line 80 by a certain distance on the upper side of the substrate 110. Even though not shown in figures, as another example, the dummy auxiliary line 831 may overlap the low-potential line 80 disposed on the upper side. In this case, the first contact hole CH1, the second contact hole CH2 and the auxiliary electrode 85 are not formed. As the result, the dummy auxiliary line 831 may not be electrically nor physically connected to the low-potential line 80 disposed on the upper side.

In the second aspect, the portion corresponding to the outermost flexible circuit films 431 and 435 where the auxiliary line is not disposed has different elements of the display device from the portion where the auxiliary line is disposed. As the result, image quality may be perceived differently depending on the presence or absence of the external light reflection by the lines. Accordingly, in the third aspect, the elements of the middle part and the outermost part are made the same. To do so, a dummy auxiliary line 831 is provided to ensure the same level of image quality across the entire display device. In particular, to maintain image quality uniformly over the entire area of the display device, the auxiliary line 83 and the dummy auxiliary line 831 may be arranged at equal intervals.

Figure 10:
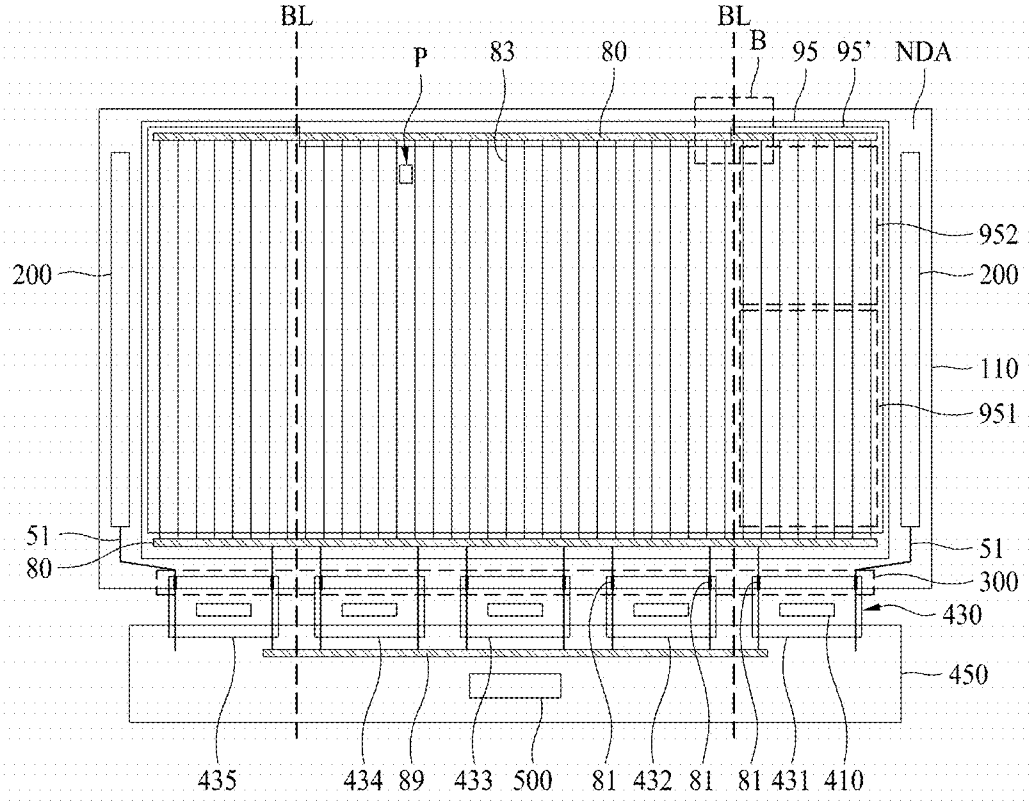
FIG. 10 is a plane view illustrating a structure of a light emitting display device according to a fourth exemplary aspect of the present disclosure.
Figure 11:
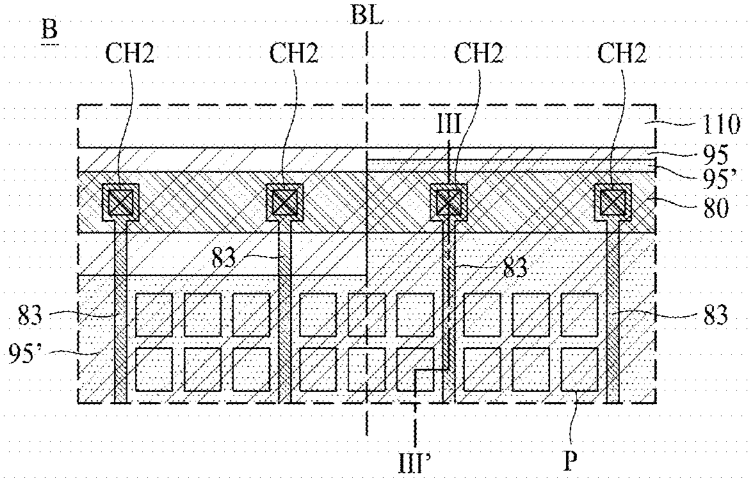
FIG. 11 is an enlarged plane view, for the portion indicated by 'B' in FIG. 10, illustrating an arrangement structure of an auxiliary line and a common electrode which are connected to the low-potential line in the outer portion of the light emitting display device according to the fourth exemplary aspect.

Hereinafter, referring to FIGS. 10 and 11, a fourth aspect of the present disclosure will be described. FIG. 10 is a plane view illustrating a structure of a light emitting display device according to a fourth aspect of the present disclosure. FIG. 11 is an enlarged plane view, for the portion indicated by 'B' in FIG. 10, illustrating an arrangement structure of an auxiliary line and a common electrode which are connected to the low-potential line in the outer portion of the light emitting display device according to the fourth aspect.

A light emitting display device according to the fourth aspect shown in FIG. 4 may have very similar structure with that of the first aspect. The different feature from the first aspect is on the stacking structure of the layers for the light emitting diode 90.

For example, the light emitting diode 90 includes an anode electrode 91, an emission layer 93 and a cathode electrode 95 sequentially stacked. In detail, an electron functional layer 95' may be further included between the emission layer 93 and the cathode electrode 95 for enhancing the electrical connection property between them.

The light emitting display device according to the fourth aspect has a structural characteristic in which the electron functional layer 95' is interposed between the cathode electrode 95 and the low-potential line 80, at the portion corresponding to the first flexible circuit film 431 disposed on the rightmost area in the display area AA. The electron functional layer 95' is in contact with the emission layer 93 and has a function for increasing the mobility of electrons supplied from the cathode electrode 95 to smoothly transfer to the emission layer 93. However, the electron functional layer 95' has relatively low charge mobility, so when it is not combined with the charge (or hole) functional layer that supplies charges (or holes) or the emission layer that receives charges (holes), the contact resistance is very high.

At the right area of the border line BL where the outermost flexible circuit films 431 and 435 is disposed, the electron functional layer 95' extended from the display area AA are disposed under the cathode electrode 95. On the other hand, at the left area where the middle flexible circuit films 432, 433 and 434 are disposed, there is no electron functional layer 95' between the cathode electrode 95 and the low-potential line 80.

Figure 12:
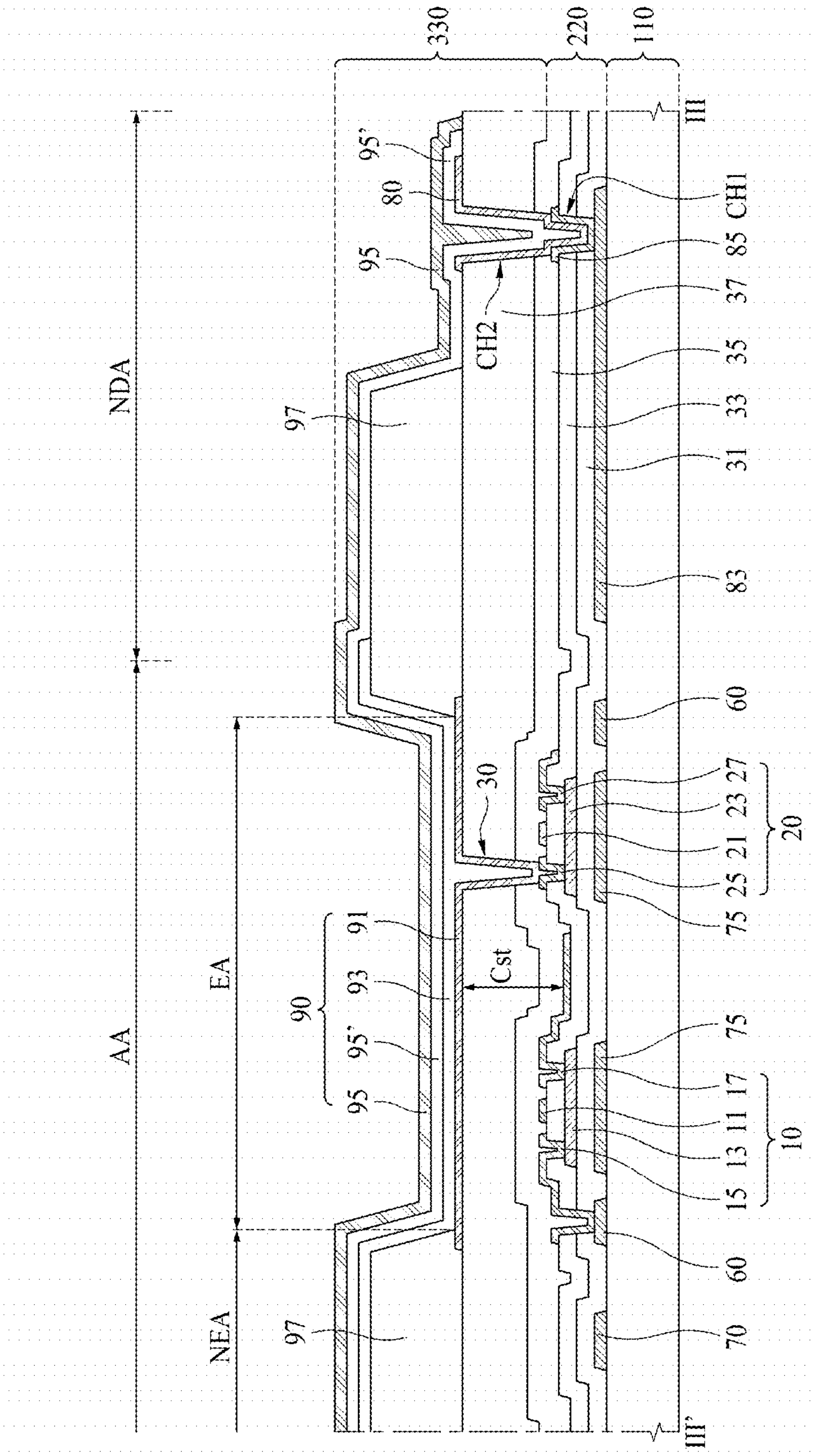
FIG. 12 is a cross-sectional view along cutting line III-III' in FIG. 11, for illustrating a structure of the light emitting display according to the fourth aspect of the present disclosure.

Hereinafter, further referring to FIG. 12, a cross-sectional structure of a portion corresponding to the flexible circuit films 431 and 435 disposed right side from the border line BL. FIG. 12 is a cross-sectional view along cutting line III-III' in FIG. 11, for illustrating a structure of the light emitting display according to the fourth aspect of the present disclosure.

The description of the same parts in FIG. 12 as in FIG. 4 is not duplicated. The light emitting diode 90 includes an emission layer 93 deposited on an anode electrode 91. Even though not shown in figures, a charge (or hole) functional layer may be further included between the anode electrode 91 and the emission layer 93. The emission layer 93 is commonly deposited as covering entire display area AA. In this case, the charge functional layer may be commonly deposited as covering entire display area AA like the emission layer 93.

An electron functional layer 95' is deposited on the emission layer 93. The electron functional layer 95' may be deposited to cover entire display area AA, and to be extended to the non-display area NDA as for covering the low-potential line 80. The cathode electrode 95 is deposited on the electron functional layer 95' as covering entire display area AA, and extended to the non-display area NDA as for connecting to the low-potential line 80.

At the upper side of the substrate 110, the auxiliary line 83 is connected to the low-potential lien 80 through the auxiliary electrode 85. At the portion corresponding to the outermost flexible circuit films 431 and 435, the electron functional layer 95' is extended from the display area AA to fully cover the low-potential line 80. On the other hand, at the portion corresponding to the middle flexible circuit films 432, 433 and 434, the electron functional layer 95' is deposited within the display area AA.

The cathode electrode 95 is deposited on the electron functional layer 95'. At the portion corresponding to the outermost flexible circuit films 431 and 435, the electron functional layer 95' and the cathode electrode 95 are in surface contact. On the other hand, at the portion corresponding to the middle flexible circuit films 432, 433 and 434, the cathode electrode 95 is in surface contact with the low-potential line 80.

Therefore, the auxiliary line 83 is physically and electrically connected to the upper low-potential line 80. However, the cathode electrode 95 is physically and electrically connected to the low-potential line 80 only at the portion corresponding to the middle flexible circuit films 432, 433 and 434 in the display area AA.

Accordingly, in the third aspect, the same electric current path as described in the second aspect may be achieved, and the electric current density may be prevented from concentrating on the low-potential terminal 81 disposed on the outermost flexible circuit films 431 and 435.

Figure 13:
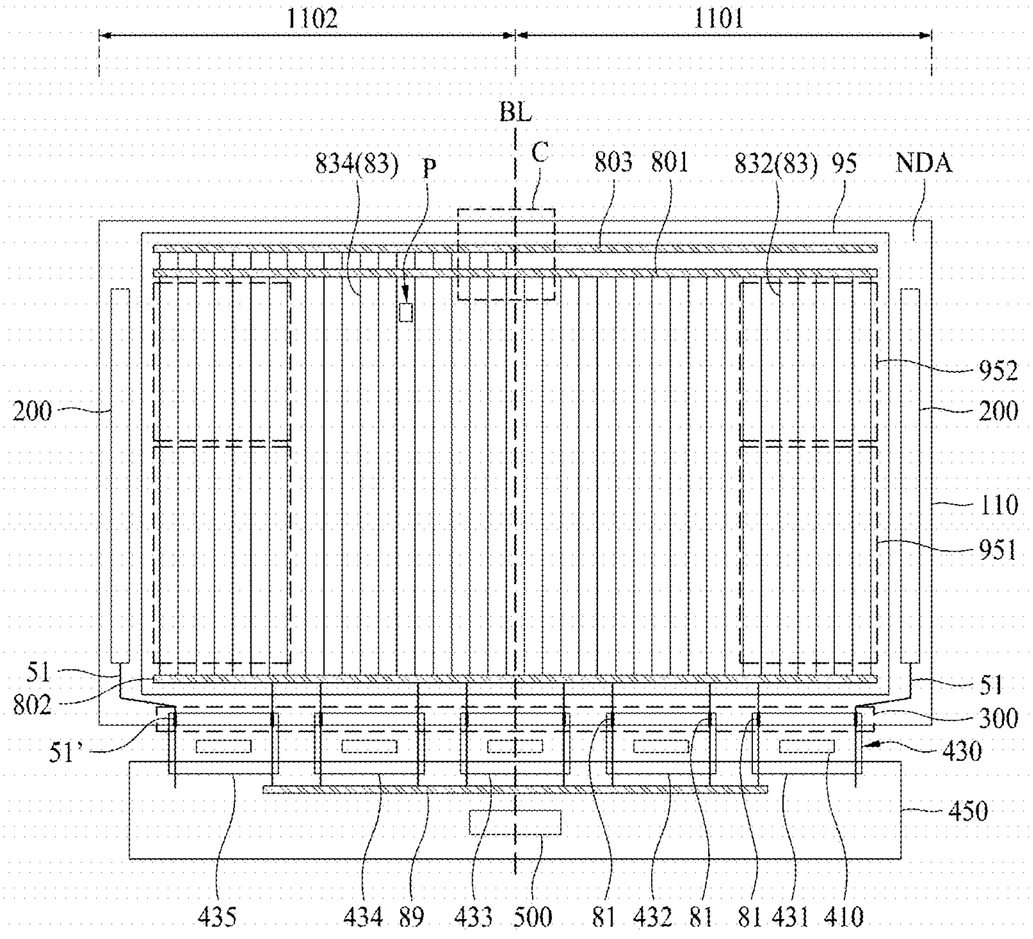
FIG. 13 is a plane view illustrating a structure of a light emitting display device according to a fifth exemplary aspect of the present disclosure.
Figure 14:
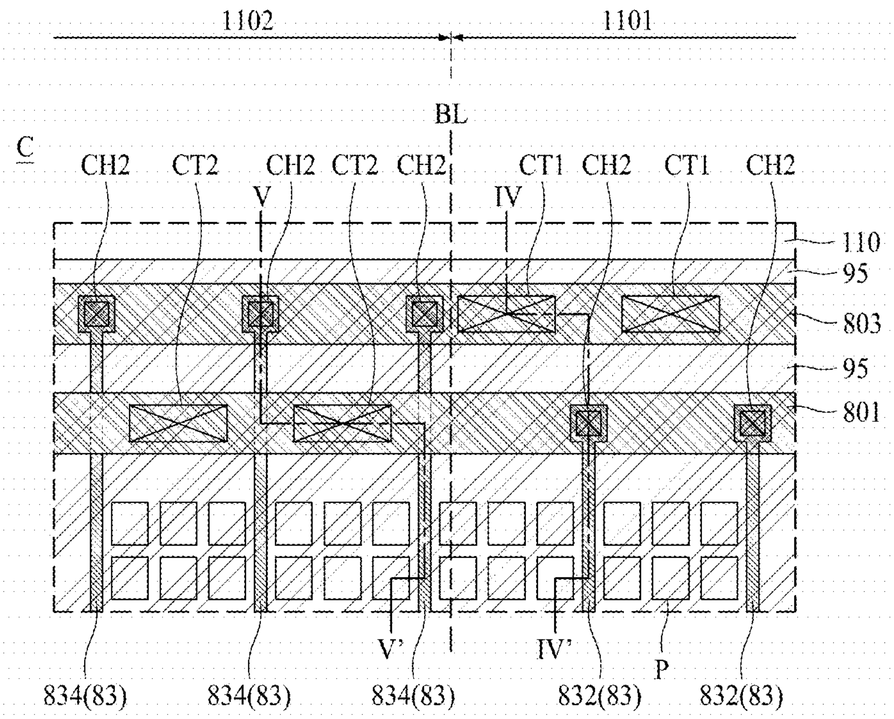
FIG. 14 is an enlarged plane view, for the portion indicated by 'C' in FIG. 13, illustrating an arrangement structure of an auxiliary line and a common electrode which are connected to the low-potential line in the outer portion of the light emitting display device according to the fifth exemplary aspect.

Hereinafter, referring to FIGS. 13 and 14, a fifth aspect of the present disclosure will be described. FIG. 13 is a plane view illustrating a structure of a light emitting display device according to a fifth aspect of the present disclosure. FIG. 14 is an enlarged plane view, for the portion indicated by 'C' in FIG. 13, illustrating an arrangement structure of an auxiliary line and a common electrode which are connected to the low-potential line in the outer portion of the light emitting display device according to the fifth aspect.

Referring to FIGS. 13 and 14, a light emitting display device according to the fifth aspect includes a substrate 110, a pad portion 300, a low-potential line 80, a low-potential terminal 81, an auxiliary line 83 and a cathode electrode 95.

The substrate 110 includes a display area AA and a non-display area NDA. The display area AA is defined at a middle portion of the substrate 110. The non-display area NDA is defined as surrounded the display area AA. The substrate 110 is divided into a first region 1101 and a second region 1102 by a border lien BL disposed on the substrate 110. The first region 1101 is allocated at the right side of the border line BL dispose on the substrate 110, and the second region 1102 is allocated at the left side of the border line BL.

The low-potential line 80 includes a first low-potential line 801, a second low-potential line 802 and a third low-potential line 803. The first low-potential line 801 and the third low-potential line 803 are disposed at the upper side of the substrate 110. The second low-potential lien 802 is disposed at the lower side of the substrate 110. The first low-potential line 801 and the third low-potential line 803 have the shape of line segments running parallel to each other in the horizontal direction of the substrate 110 and being separated with a certain distance. The third low-potential line 803 may be disposed outer side than the first low-potential line 801 on the substrate 110. The second low-potential line 802 may face the third low-potential line 803, and have a line segment shape running parallel to the horizontal direction of the substrate 110.

The pad portion 300 may be disposed at the lower side of the substrate 110. For example, the pad portion 300 may be disposed at outside of the second low-potential line 82 disposed at the lower side of the substrate 110. The low-potential terminal 81 may be disposed at the pad portion 300.

The low-potential terminal 81 disposed at the pad portion 300 is connected to the second low-potential line 802. A plurality of the low-potential terminals 81 may be arrayed. For example, a plurality of flexible circuit films 430 are disposed at the pad portion 300. FIG. 13 shows five flexible circuit films 431,432, 433, 434 and 435 in convenience. In detail, the flexible circuit film 430 may include one rightmost flexible circuit film 431, one leftmost flexible circuit film 435 and three middle flexible circuit films 432, 433 and 434.

Each of the rightmost flexible circuit film 431 and the leftmost flexible circuit film 435 includes one low-potential terminal 81 and one gate terminal 51' connecting to the gate supply line 51. Each of the middle flexible circuit films includes two low-potential terminals 81 without the gate terminal 51'.

The auxiliary line 83 includes a plurality of first auxiliary lines 832 and a plurality of second auxiliary lines 834. The plurality of the first auxiliary lines 832 are disposed in the first region 1101, and is connected between the first low-potential line 801 and the second low-potential line 802. The plurality of the second auxiliary lines 834 are disposed in the second region 1102, and is connected between the third low-potential line 803 and the second low-potential line 802.

The common electrode 95 is deposited as one sheet layer covering entire area of the substrate 110. The common electrode 95 covers the first region 1101 and the second region 1102. The common electrode 95 overlaps the second low-potential line 802 and contacts in surface with the second low-potential line 802. The common electrode 95 is not connected to the first low-potential line 801, but to the third low-potential line 803 at the first region 1101. The common electrode 95 is not connected to the third low-potential line 803, but to the first low-potential line 801 at the second region 1102.

Figure 15:
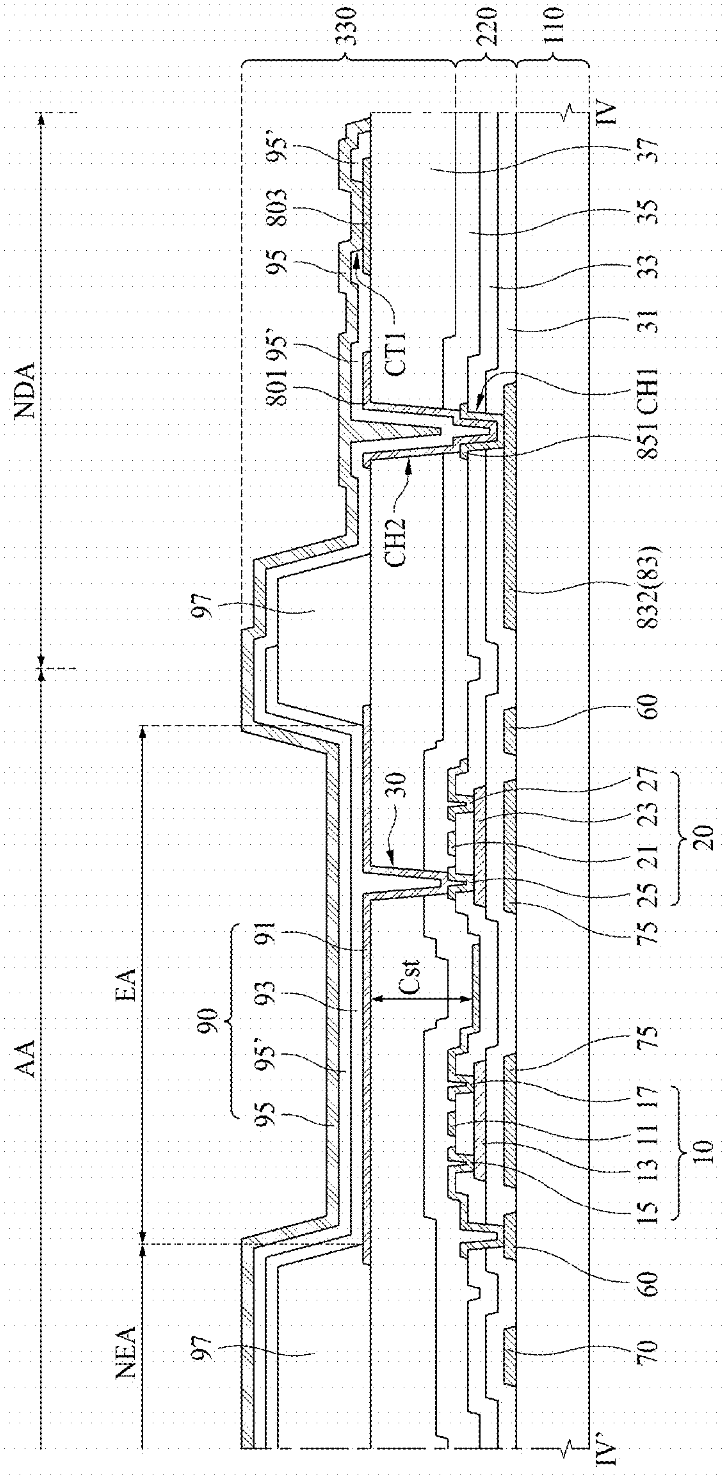
FIG. 15 is a cross-sectional view along cutting line IV-IV' in FIG. 13, for illustrating a structure of the light emitting display according to the fifth exemplary aspect of the present disclosure.
Figure 16:
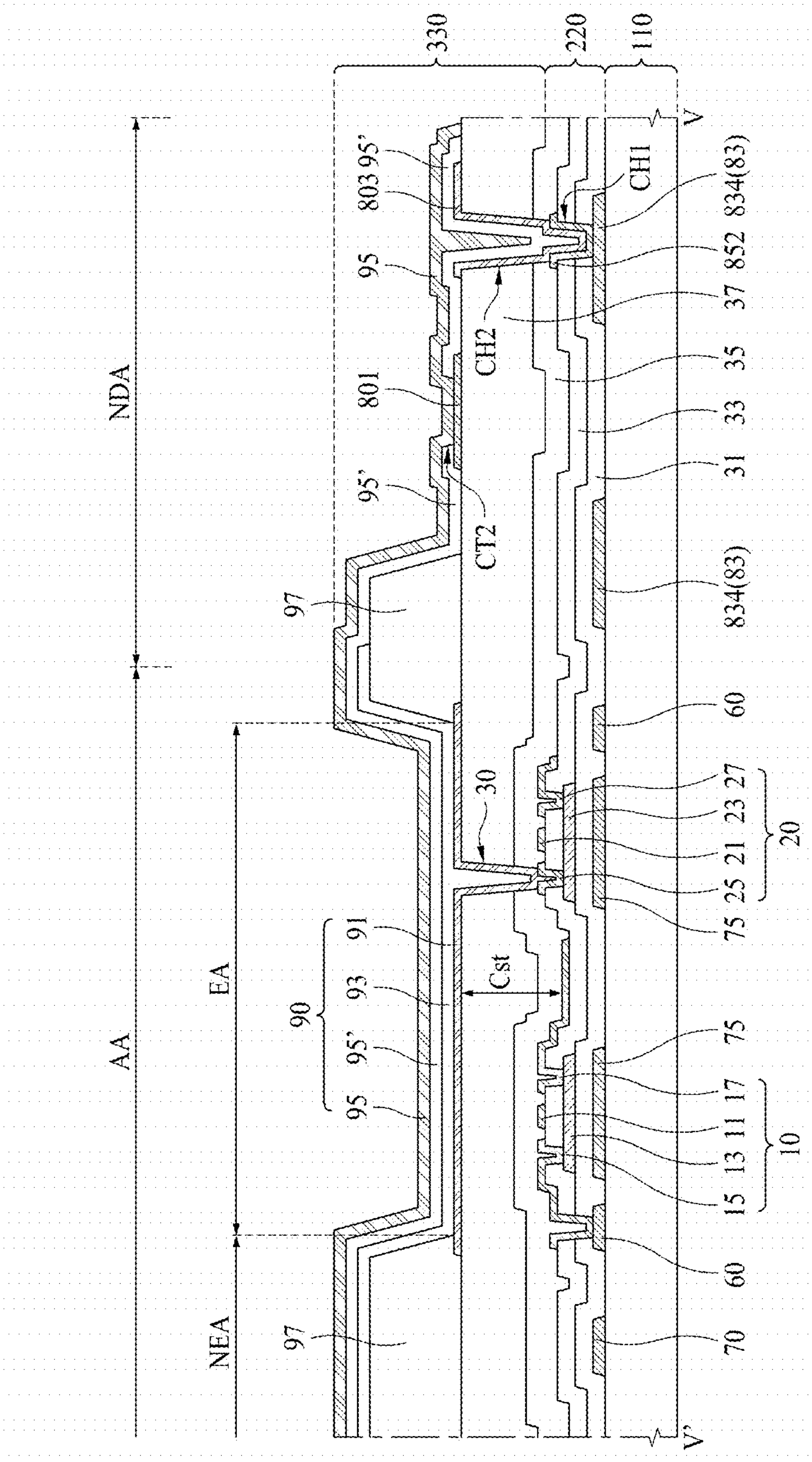
FIG. 16 is a cross-sectional view along cutting line V-V' in FIG. 13, for illustrating a structure of the light emitting display according to the fifth exemplary aspect of the present disclosure.

Hereinafter, referring to FIGS. 15 and 16, a cross-sectional structure of the light emitting display device according to the fifth aspect of the present disclosure. FIG. 15 is a cross-sectional view along cutting line IV-IV' in FIG. 13, for illustrating a structure of the light emitting display according to the fifth aspect of the present disclosure. FIG. 16 is a cross-sectional view along cutting line V-V' in FIG. 13, for illustrating a structure of the light emitting display according to the fifth aspect of the present disclosure.

The cross-sectional structure of the light emitting display device according to the fifth aspect is very similar to that of the first aspect shown in FIG. 4, so the description will focus on the different features. The description for the same structure refers to the description with FIG. 4.

Referring to FIGS. 13, 14 and 15, the structure of the first region 1101 will be explained. A first auxiliary line 832 is formed on the substrate 110. The first auxiliary line 832 may have a length that starts from a point overlapping with the second low-potential line 802 formed later and ends to a point overlapping with the first low-potential line 801.

A buffer layer 31 and a gate insulating layer 33 are sequentially deposited on the first auxiliary line 832. A first contact hole CH1 is formed at the gate insulating layer 33 and the buffer layer 31 to expose end portion of the first auxiliary line 832. A first auxiliary electrode 851 is formed on the gate insulating layer 33. The first auxiliary electrode 851 is contacted to the first auxiliary line 832.

A passivation layer 35 is deposited on the first auxiliary electrode 851. A planarization layer 37 is deposited on the passivation layer 35. A second contact hole CH2 is formed at the planarization layer 378 and the passivation layer 35 to expose some of the first auxiliary electrode 851.

A first low-potential line 801 and a third low-potential line 803 are formed on the planarization layer 37. The first low-potential line 801 and the third low-potential line 803 are disposed in parallel with a predetermined distance. The first low-potential line 801 is in contact with the first auxiliary electrode 851 via the second contact hole CH2.

Within the display area AA, an anode electrode 91 made of the same material and at the same layer with the first low-potential line 801 and the third low-potential line 803. The circumferential areas of the anode electrode 91 are covered by the bank 97, which defines the emission area EA. The bank 97, not covering the first low-potential line 801 and the third low-potential line 803, may be formed only near the boundary between the display area AA and the non-display area NDA.

An emission layer 93 is deposited on the anode electrode 91 and the bank 97. The emission layer 93 is commonly deposited over entire display area AA on the substrate 110. The emission layer 93 may be extended only to the upper surface of the bank 97 in the non-display area NDA. Therefore, the first low-potential line 801 and the third low-potential line 803 do not contact with the emission layer 93.

An electron functional layer 95' is deposited on the emission layer 93. The electron functional layer 95' is deposited over entire display area AA and extended to the non-display area NDA as covering the first low-potential line 801 and the third low-potential line 803.

In the first region 1101, by patterning the electron functional layer 95' covering the third low-potential line 803, a first low-potential contact hole CT1 is formed to expose some of the third low-potential line 803. However, in the first region 1101, the first low-potential line 801 is covered by the electron functional layer 95' as being in surface contact with the electron functional layer 95'. A cathode electrode 95 is deposited on the electron functional layer 95'. In the first region 1101, the cathode electrode 95 is not in contact with the first low-potential line 801, but is in contact with the third low-potential line 803.

Next, referring to FIGS. 13, 14 and 16, a structure of the second region 1102 will be explained. A second auxiliary line 834 is formed on the substrate 110. The second auxiliary line 834 may have a length that starts from a point overlapping with the second low-potential line 802 formed later and ends to a point overlapping with the third low-potential line 803.

A buffer layer 31 and a gate insulating layer 33 are sequentially deposited on the second auxiliary line 834. A first contact hole CH1 is formed at the gate insulating layer 33 and the buffer layer 31 to expose end portion of the second auxiliary line 834. A second auxiliary electrode 852 is formed on the gate insulating layer 33. The second auxiliary electrode 852 is contacted to the second auxiliary line 834.

A passivation layer 35 is deposited on the second auxiliary electrode 852. A planarization layer 37 is deposited on the passivation layer 35. A second contact hole CH2 is formed at the planarization layer 378 and the passivation layer 35 to expose some of the second auxiliary electrode 852.

The first low-potential line 801 and the third low-potential line 803 are formed on the planarization layer 37. The first low-potential line 801 and the third low-potential line 803 are disposed in parallel with a predetermined distance. The third low-potential line 803 is in contact with the second auxiliary electrode 852 via the second contact hole CH2.

Within the display area AA, the anode electrode 91 made of the same material and at the same layer with the first low-potential line 801 and the third low-potential line 803. The circumferential areas of the anode electrode 91 are covered by the bank 97, which defines the emission area EA. The bank 97, not covering the first low-potential line 801 and the third low-potential line 803, may be formed only near the boundary between the display area AA and the non-display area NDA.

The emission layer 93 is deposited on the anode electrode 91 and the bank 97. The emission layer 93 is commonly deposited over entire display area AA on the substrate 110. The emission layer 93 may be extended only to the upper surface of the bank 97 in the non-display area NDA. Therefore, the first low-potential line 801 and the third low-potential line 803 do not contact with the emission layer 93.

An electron functional layer 95' is deposited on the emission layer 93. The electron functional layer 95' is deposited over entire display area AA and extended to the non-display area NDA as covering the first low-potential line 801 and the third low-potential line 803. In the second region 1102, by patterning the electron functional layer 95' covering the first low-potential line 801, a second low-potential contact hole CT2 is formed to expose some of the first low-potential line 801. However, in the second region 1102, the third low-potential line 803 is covered by the electron functional layer 95' as being in surface contact with the electron functional layer 95'. The cathode electrode 95 is deposited on the electron functional layer 95'. In the second region 1102, the cathode electrode 95 is not in contact with the third low-potential line 803, but is in contact with the first low-potential line 801.

The fifth aspect is explained as for the case of using the electron functional layer 95' in which the first low-potential line 801 is not in contact with the cathode electrode 95 in the second region 1102, and the third low-potential line 803 is not in contact with the cathode electrode 95 in the first region 1101. However, the present disclosure is not limited thereto. An additional insulating layer instead of the electron functional layer is disposed in the non-display area NDA to cover the first low-potential line 801 and the third low-potential line 803, and then the first potential contact hole CT1 and the second potential contact hole CT2 may be formed.

As a result, at the lower side of the first region 1101, an electric current path is formed from the cathode electrode 95 through the second low-potential line 802 to the low-potential terminal 81. At the upper side of the first region 1101, an electric current path is formed from the cathode electrode 95 through the second auxiliary line 834 to the low-potential terminal 81 of the second region 1102.

Likewise, at the lower side of the second region 1102, an electric current path is formed from the cathode electrode 95 through the second low-potential line 802 to the low-potential terminal 81. At the upper side of the second region 1102, an electric current path is formed from the cathode electrode 95 through the first low-potential line 801 and the first auxiliary line 832 to the low-potential terminal 81 of the first region 1101.

That is, the present disclosure may achieve the effect of even distribution of electric current by that the low-potential voltage from the cathode electrode 95 is transmitted to the low-potential terminal 81 disposed at the first region 1101 and the low-potential terminal 81 disposed at the second region 1102. Accordingly, the electric current may be prevented from being concentrated on a specific low-potential terminal 81.

In the various aspects of the present disclosure, the high-potential line connecting to the driving current line 70 is not described in detail. For example, in FIG. 4, a light-potential line may be further disposed between the low-potential line 80 (disposed on the upper and lower sides) and the display area AA. The high-potential line may be arranged parallel to the low-potential line 80. In the cross-sectional structure, the high-potential line may be disposed on a different layer from the low-potential line 80. For an example, when the low-potential line 80 is disposed on the same layer as the light shielding layer 75, the high-potential line may be disposed on the same layer as the source electrodes 15 and 25 and the drain electrodes 17 and 27. For another example, an additional layer that is different from the light shielding layer 75, the source electrodes 15 and 25, or the drain electrodes 17 and 27 may be formed.

The features, structures, effects and so on described in the above example aspects of the present disclosure are included in at least one example aspect of the present disclosure, and are not necessarily limited to only one example aspect. Furthermore, the features, structures, effects and the like explained in at least one example aspect may be implemented in combination or modification with respect to other example aspects by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that aspects of the present disclosure cover the various substitutions, modifications, and variations of the present disclosure, provided they come within the scope of the appended claims and their equivalents. These and other changes may be made to the aspects in light of the above detailed description. In general, in the following claims, the terms used should not be construed to limit the claims to the specific example aspects disclosed in the specification and the claims, but should be construed to include all possible aspects along with the full scope of equivalents to which such claims are entitled. Accordingly, the claims are not limited by the disclosure.

What is claimed is:

1. A light emitting display comprising:

a substrate including a display area and a non-display area surrounding the display area;

a low-potential line including a first low-potential line disposed at an upper side of the substrate, and a second low-potential line disposed at a lower side of the substrate;

a pad portion disposed outside the second low-potential line on the substrate;

a first region defined at right side of the substrate, and a second region defined at left side of the substrate;

a first low-potential terminal disposed to be corresponding to the first region at the pad portion, and connected to the second low-potential line; and a second low-potential terminal and a third low-potential terminal disposed to be corresponding to the second region at the pad portion, and connected to the second low-potential line;

a plurality of auxiliary lines connected between the first low-potential line and the second low-potential line in the second region except the first region; and a common electrode extended from the display area to be in surface contact with the low-potential line.

2. The light emitting display according to claim 1, wherein the plurality of auxiliary lines is not disposed in the first region.

3. The light emitting display according to claim 1, wherein the second low-potential terminal is disposed at a first side of the second region, and wherein the third low-potential terminal is disposed at a second side of the second region opposing the first side of the second region.

4. The light emitting display according to claim 1, wherein the first low-potential terminal is disposed at a first side of the first region, and a gate signal terminal for supplying a gate signal is further disposed at a second side of the first region opposing the first side of the first region.

5. The light emitting display according to claim 1, further comprising a plurality of dummy auxiliary lines connected to the first low-potential line except the second low-potential line in the second region.

6. The light emitting display according to claim 5, wherein the auxiliary lines and the dummy auxiliary lines are arrayed with same intervals.

7. The light emitting display according to claim 1, wherein the plurality of auxiliary lines is disposed to be in contact with the first low-potential line and the second low-potential line in the second region, and an electron functional layer disposed between the low-potential line and the common electrode.

8. The light emitting display according to claim 7, further comprising a light emitting diode disposed in the display area, wherein the light emitting diode includes:

an anode electrode; and an emission layer on the anode electrode;

wherein the electron functional layer on the emission layer, wherein the common electrode on the electron functional layer, wherein the electron functional layer is disposed within the display area in the first region, and wherein the electron functional layer is extended from the display area to be disposed between the low-potential line and the common electrode in the second region.

9. The light emitting display according to claim 1, further comprising a third low-potential line disposed outside the first low-potential line on the substrate, wherein the auxiliary line is connected to the first low-potential line in the first region, and wherein the auxiliary line is connected to the third low-potential line in the second region.

10. The light emitting display according to claim 9, further comprising an insulating layer covering the first low-potential line and the third low-potential line in the non-display area, wherein the insulating layer includes:

a first contact hole disposed in the first region except the second region for exposing some of the third low-potential line; and a second contact hole disposed in the second region except the first region for exposing some of the first low-potential line.

11. The light emitting display according to claim 10, wherein the common electrode is connected to the third low-potential line through the first contact hole, and connected to the first low-potential line through the second contact hole.

12. The light emitting display according to claim 10, further comprising a light emitting diode disposed in the display area, wherein the light emitting diode includes:

an anode electrode;

an emission layer on the anode electrode; and an electron functional layer on the emission layer, wherein the common electrode on the electron functional layer, and wherein the insulating layer is some extended parts of the electron functional layer from the display area to the non-display area for covering the first low-potential line and the third low-potential line.

* * * * *